United States Patent [19]

Kegasa et al.

[11] Patent Number: 4,797,637
[45] Date of Patent: Jan. 10, 1989

[54] PLL FREQUENCY SYNTHESIZER

[75] Inventors: Koyo Kegasa; Takafumi Murai; Osamu Yamanaka; Takeshi Fujii, all of Hyogo, Japan

[73] Assignee: Mitsubishi Denki Kabushiki Daisha, Tokyo, Japan

[21] Appl. No.: 88,663

[22] Filed: Aug. 24, 1987

[30] Foreign Application Priority Data

Aug. 28, 1986 [JP] Japan .................................. 61-203410

[51] Int. Cl.$^4$ ............................................. H03L 7/00
[52] U.S. Cl. .......................................... 331/4; 331/17; 331/25; 331/178
[58] Field of Search ........................ 331/4, 17, 25, 178; 455/118, 120

[56] References Cited

U.S. PATENT DOCUMENTS 4,486,717 12/1984 Yamasaki ........................... 331/17 X Primary Examiner—Eugene R. LaRoche
Assistant Examiner—Robert J. Pascal
Attorney, Agent, or Firm—Wolf, Greenfield & Sacks

[57] ABSTRACT

A PLL frequency synthesizer comprises a voltage controlled oscillator which oscillates in response to a frequency signal corresponding to a control signal to be input and which outputs the frequency signal as an output of said PLL frequency synthesizer; a multiplier means for multiplying a reference frequency signal to be input; a mixer for mixing the frequency signal which is output from the voltage controlled oscillator and the multiplied reference frequency signal which is output from the multiplier, and for outputting a frequency signal representative of a difference therebetween; a variable frequency divider for dividing the difference frequency signal at a variable dividing ratio; a fixed frequency divider for dividing the reference frequency signal at a predetermined dividing ratio; a frequency phase comparator for detecting a phase difference between an output signal from the variable frequency divider and an output signal from the fixed frequency divider and for outputting a phase difference signal therebetween; a filter for removing high frequency components of the phase difference signal which is supplied as the control signal to the voltage controlled oscillator; and a device for switching the polarity of the phase difference signal. An output frequency of the voltage controlled oscillator can be switched to either a frequency higher than or a frequency lower than the frequency which is H (H is a positive integer) times as high as the output frequency of the multiplier, or the output frequency of the voltage controlled oscillator can be switched to either a frequency higher than the frequency which is H times as high as the output frequency of the multiplier or a frequency lower than the frequency which is (H+1) times as high as the output frequency of the multiplier.

8 Claims, 6 Drawing Sheets

Fig. 8
(a) 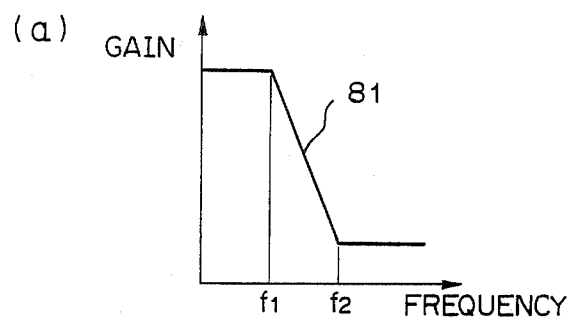
(b) 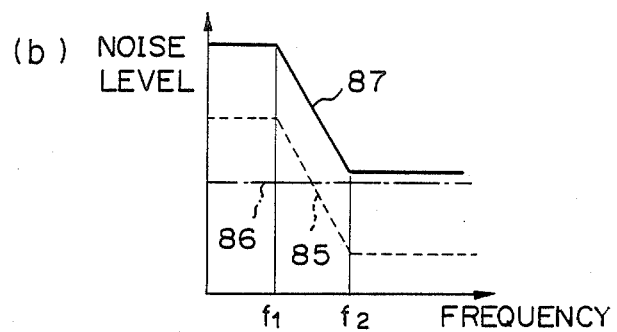
(c) 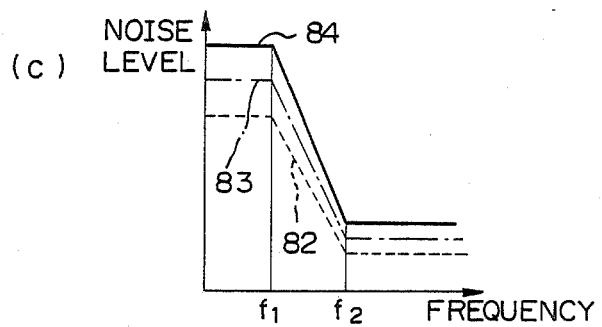

PLL FREQUENCY SYNTHESIZER

FIELD OF THE INVENTION

The present invention relates to a PLL frequency synthesizer for use as, e.g., a local oscillator of a radio transmitter.

DESCRIPTION OF THE RELATED BACKGROUND ART

FIG. 1 shows an example of a conventional frequency synthesizer. In the diagram, reference numeral 1 denotes a signal generator which may be generally constituted by a crystal oscillator or constituted by a high stable device. A reference sgnal $F_r$ is output from the generator 1. An input signal from an external circuit may be also used as a reference signal. Reference numeral 2 denotes a reference signal multiplier; 3 is a mixer; 8 a fixed frequency divider; 9 a frequency phase comparator. The reference signal $F_r$ is divided into two signals. One of these signals is multiplied by L by the multiplier 2 and is input as a signal F to the mixer 3. The other signal is frequency divided into 1/M by the fixed frequency divider 8 and, thereafter, it is input as a reference signal $F_s$ to the comparator 9.

Reference numeral 4 denotes a voltage controlled oscillator (VCO); 5 a difference signal amplifier; 6 a variable frequency divider; 7 a frequency controller; and 10 a loop filter. An output signal $F_o$ of the VCO 4 is divided into two signals. One of these signals is taken out as an output of the synthesizer. The other signal is input to the mixer 3. The mixer 3 takes out a frequency $F_i$ of the difference between the output $F_o$ of the VCO 4 and the output F of the multiplier 2 and then sends it to the amplifier 5. This frequency signal is amplified by the amplifier 5 and the resultant difference signal is divided into 1/N by the variable frequency divider 6 and is input as a signal $F_c$ to the comparator 9.

The comparactor 9 compares the reference signal $F_s$ with the signal $F_c$ and outputs a voltage corresponding to the phase difference between these signals. This output is supplied to the low pass filter (loop filter) 10 which is generally constituted by an active filter. The high frequency component is removed by this filter and is input to a frequency control terminal of the VCO 4. Thus, the VCO 4 outputs a signal of the frequency corresponding to the voltage input to the frequency control terminal.

A closed loop is constituted in this manner. The output of the VCO 4 becomes a frequency signal such that the signals $F_c$ and $F_s$ finally have the same frequency and are synchronized with a constant phase difference.

Between the output frequency $F_o$ of a conventional PLL frequency synthesizer and a reference input frequency $F_r$, there is a relation represented by either one of the following equations (1) and (2). This frequency relation is shown in FIG. 3.

In FIG. 3, solid lines indicate an example when N=3 and the relation is based on the equation (2).

$$F_o = F_r \times L - \frac{F_r}{M} \times N = F_r \left( L - \frac{N}{M} \right) \quad (1)$$

where, $F_o < F_r \times L$ $$F_o = \frac{F_r}{M} \times N + F_r \times L = F_r \left( \frac{N}{M} + L \right) \quad (2)$$

where, $F_o > F_r \times L$.

Therefore, by sequentially changing the value of N by "1" at one time by the controller 7, the value of $F_o$ can be changed by $F_r/M = F_s$ steps.

The reason why the frequency to be divided is set to a low frequency by use of the mixer in this manner is to cope with the case where the value of $F_o$ is so high due to a microwave band or the like that a proper frequency divider cannot be obtained or where it is intended to set a value of frequency dividing ratio to a small value.

Whether the $F_o$ is expressed by the equation (1) or the equation (2) is determined by whether the output $F_o$ of the VCO 4 is set to the higher frequency or the lower frequency when there is a relation of $F_c > F_s$ between the input signals $F_c$ and $F_s$ of the frequency phase comparator 9. For example, when $F_c > F_s$, if the output $F_o$ of the VCO 4 is set to the higher frequency, the value of $F_o$ becomes stable at the frequency expressed by the equation (1), while the value of $F_o$ becomes stable at the frequency expressed by the equation (2) if the output $F_o$ of the VCO 4 is set to the lower frequency.

The decision as to whether the output $F_o$ of the VCO 4 is set to the higher frequency or the lower frequency depends on a change in polarity of the signal passing through the comparator 9, VCO 4, and loop filter 10.

The conventional frequency synthesizer is constituted in this manner. Therefore, to change the output frequency $F_o$ within a range of a band W, the difference frequency $F_i$ must also be changed within the range of the band W, and thus the variable frequency divider 6 also needs to operate within the frequency band of W. Accordingly, there is a problem in that an expensive variable frequency divider of a wide band type is necessary to make a frequency synthesizer of a wide band type.

SUMMARY OF THE INVENTION

The present invention was accomplished in order to solve the foregoing problems and, therefore, it is an object of the invention to provide a PLL frequency synthesizer which can obtain an output frequency of a wide band without using a variable frequency divider of a wide band type.

Another object of the invention is to provide a PLL frequency synthesizer in which a polarity switching device is provided between the frequency phase comparator and the VCO in the foregoing conventional constitution.

According to the invention, a polarity switching device is provided between the frequency phase comparator and the VCO, an output frequency range is divided into two ranges, and a polarity is switched by the polarity switching device in such a manner that the equation (1) is satisfied in a low frequency range while the equation (2) is satisfied in a high frequency range, thereby making it possible to output a signal in a double frequency band $W_O$ of the frequency band $W_D$ which can be used by the variable frequency divider, namely, in the frequency of $W_O = 2 \times W_D$.

BRIEF DESCRIPTION OF THE DRAWINGS

FIG. 8($a$) is a diagram showing the gain/frequency characteristics of a low pass filter in the loop filter circuit;

FIG. 8($b$) is a diagram showing the output noise level/frequency characteristics of the loop filter circuit in FIG. 6; and FIG. 8($c$) is a diagram showing the output noise level/frequency characteristics of the loop filter circuit in FIG. 7.

DESCRIPTION OF THE PREFERRED EMBODIMENTS

Figure 1:
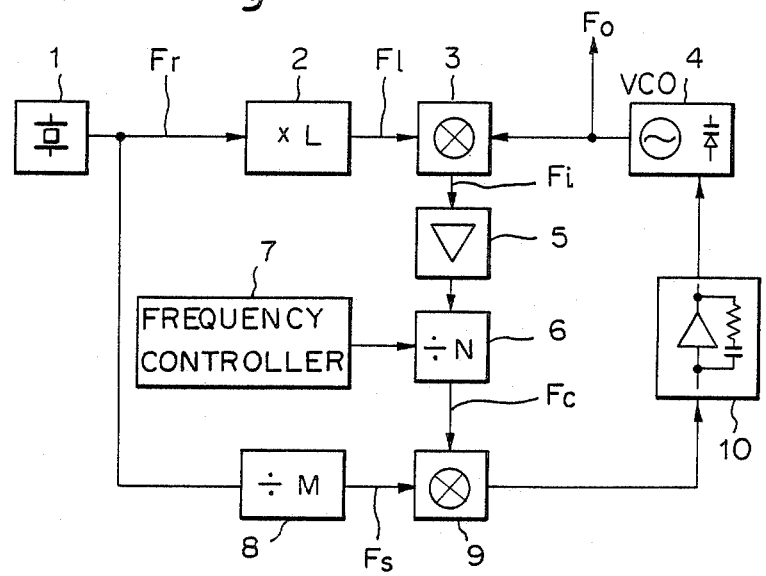
FIG. 1 is a diagram showing a conventional PLL frequency synthesizer.
Figure 2:
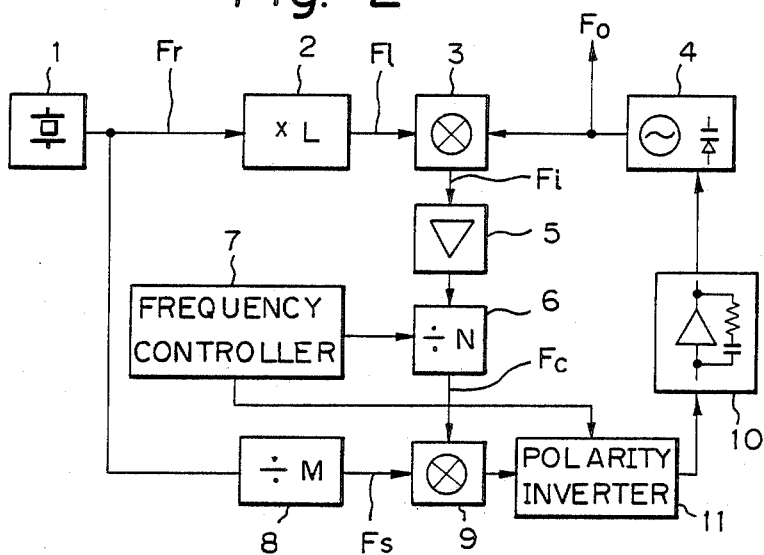
FIG. 2 is a diagram showing a frequency synthesizer according to an embodiment of the present invention.
Figure 3:
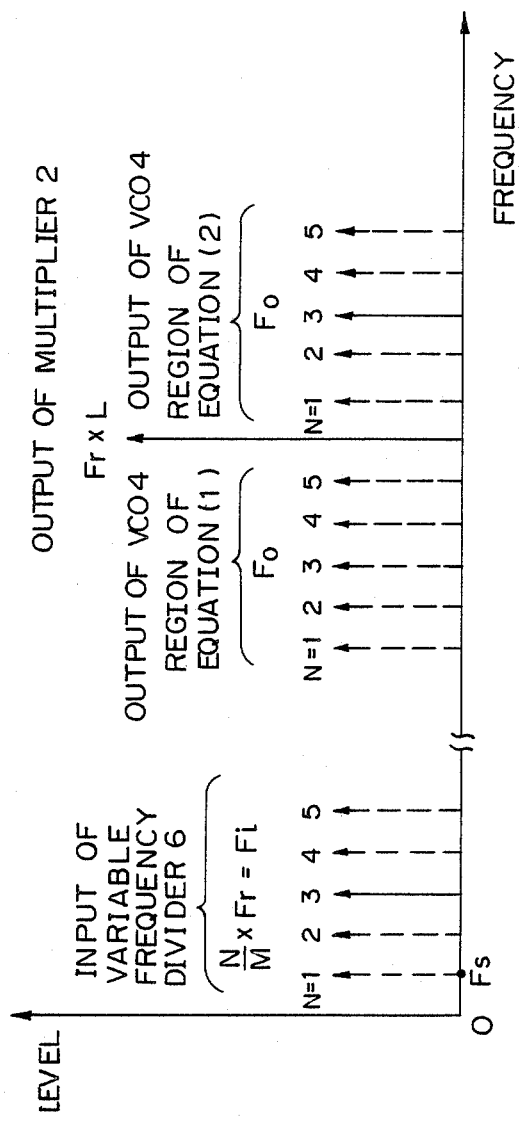
FIG. 3 is a diagram showing the frequency relation in the PLL frequency synthesizer according to one embodiment of the invention.

An embodiment of the present invention will be described hereinbelow with reference to the drawings. FIG. 2 shows a PLL frequency synthesizer according to an embodiment of the present invention. In the diagram, reference numerals 1 to 10 denote the same parts and components as those shown in the conventional frequency synthesizer shown in FIG. 1.

A polarity inverter 11 receives a signal from the controller 7 and in response thereto outputs a signal having either the same polarity as that of a phase difference voltage signal from the frequency phase comparator 9 or the opposite polarity, the output signal being applied to the loop filter 10.

In this embodiment, it is assumed that the phase difference signal of the comparator 9 is set in the positive voltage when there is a relation of $F_c > F_s$ between the reference signal $F_s$ and the output signal $F_c$ of the variable frequency divider 6; is set in the negative voltage when $F_c < F_s$; and is set to the voltage proportional to the phase difference between $F_c$ and $F_s$ when $F_c = F_s$. It is also assumed that the output voltage having the polarity opposite to that of the input signal is output from the loop filter 10, and also that the output frequency of the VCO 4 increases when the voltage applied to the frequency control terminal thereof is set to a positive value and that the output frequency decreases when the voltage is set to a negative value.

First, the operation in the case where the polarity inverter 11 outputs a signal of the same polarity as that of the input signal will be described. When the output signal $F_c$ of the variable frequency divider 6 is slightly lower than the reference signal $F_s$, the output signal of the comparator 9 is set to a negative value and hence the output of the loop filter 10 is shifted to a positive value. Thus, the output frequency $F_o$ of the VCO 4 increases. Therefore, when the output frequency $F_o$ lies within a region of $F_o < F_r \times L$, the following equation is obtained from the equation (1).

$$F_o = F_r \times L - \frac{F_r}{M} \times N = F_r \times L - F_c \times N \quad (3)$$

where, $F_c = (F_r \times L - F_o)/N$.

The value of $F_c$ decreases more and more, so that the value of $F_o$ increases more and more and soon becomes higher than $F_r \times L$. When the output frequency $F_o$ is within a range of $F_o > F_r \times L$, the following equation is obtained from the equation (2).

$$F_o = F_r \times L + \frac{F_r}{M} \times N = F_r \times L + F_c \times N$$

therefore, $$F_c = (F_o - F_r \times L_o)/N \quad (4)$$

Then, the $F_c$ increases and becomes stable when $F_c = F_s$. Therefore, when the polarity inverter 11 outputs a signal of the same polarity as that of the input signal, the output frequenc $F_o$ is expressed by the equation (2) and becomes higher than $F_r \times L$.

The operation conducted in the case where the polarity inverter 11 outputs a signal of the polarity opposite to that of the input signal will now be explained. When the output signal $F_c$ of the variable frequency divider 6 is slightly higher than the reference signal $F_s$, the output signal of the comparator 9 is set to a positive value and the output of the loop filter 10 is shifted to a negative value. Thus, the output $F_o$ of the VCO 4 decreases. When the output frequency $F_o$ lies within a range of $F_o > F_r \times L$, the value of $F_c$ decreases more and more in accordance with the equation (4), so that the $F_o$ is reduced more and more and soon becomes lower than $F_r \times L$.

When the output frequency $F_o$ lies within a range of $F_o < F_r \times L$, the $F_c$ increases in accordance with the equation (3) and becomes stable when $F_c = F_s$. Therefore, when the polarity inverter 11 outputs a signal of the polarity opposite to that of the input signal, the output frequency $F_o$ is expressed by the equation (1) and becomes lower than $F_r \times L$.

By operating the polarity inverter 11 in this manner, the output frequency $F_o$ can be set into either the region of $F_o < F_r \times L$ or the region of $F_o > F_r \times L$. The frequency range which is twice as wide as the band of the variable frequency divider 6 can be set into the output frequency range.

In the foregoing embodiment, the polarity inverter 11 is provided between the frequency phase comparator 9 and the loop filter 10. However, the polarity inverter 11 may be also provided between the loop filter 10 and the VCO 4. In this case, an effect similar to that in the foregoing embodiment can also be obtained.

On the other hand, even when a switching circuit for switching between $F_c$ and $F_s$ at the input of the comparator 9 is provided, an effect similar to that in the foregoing embodiment can also be obtained.

In addition, a harmonic mixer having a frequency multiplying function can also be used as the mixer in the foregoing embodiment. In this case, assuming that the multiplying degree of the harmonic mixer is H, the equations (1) and (2) will be $$F_o = F_r \times L \times H - F_r \times \frac{N}{M} = F_r\left(L \times H - \frac{N}{M}\right) \quad (5)$$

where, $F_o < F_r \times L \times H$ $$F_o = F_r \times L \times H + F_r \times \frac{N}{M} = F_r\left(L \times H + \frac{N}{M}\right) \quad (6)$$

where, $F_o > F_r \times L \times H$.

Figure 4:
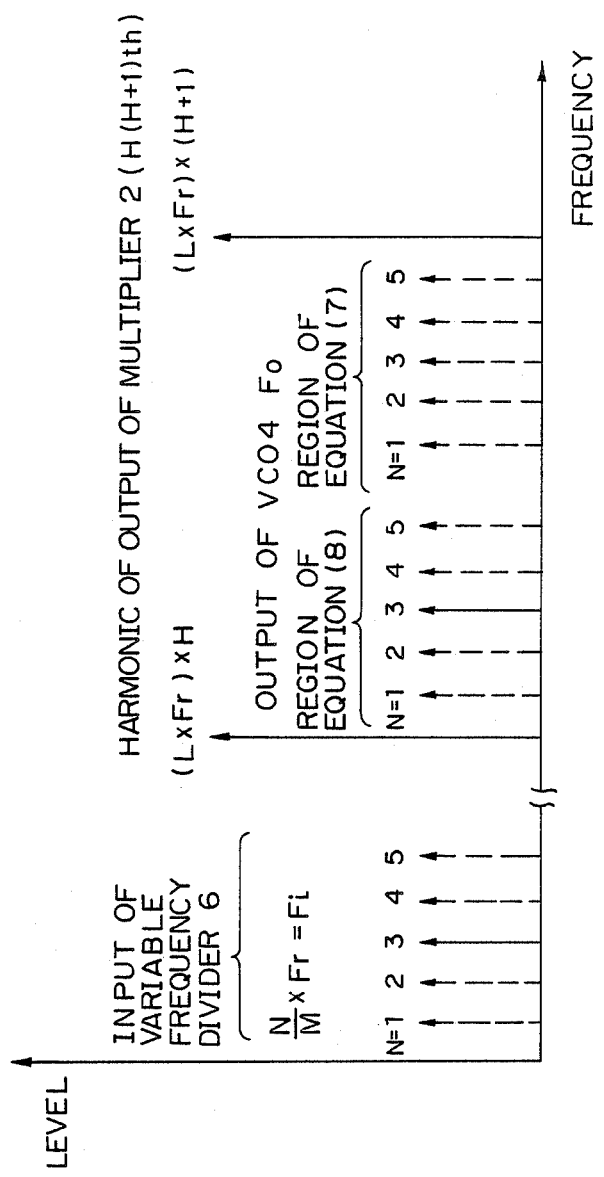
FIGS. 4 and 5 are diagrams showing the frequency relations in other embodiments of the invention.

In the case of using a harmonic mixer as the mixer 3, the frequencies may also be set as shown in FIG. 4. Namely, when the polarity inverter 11 outputs a signal of the same polarity as that of the input signal, $$F_o = (L \times F_r) \times H + \frac{N}{M} F_r \quad (7)$$

When the polarity inverter 11 outputs a signal of the polarity opposite to that of the input signal, $$F_o = (L \times F_r) \times (H + 1) - \frac{N}{M} F_r \quad (8)$$

Figure 5:
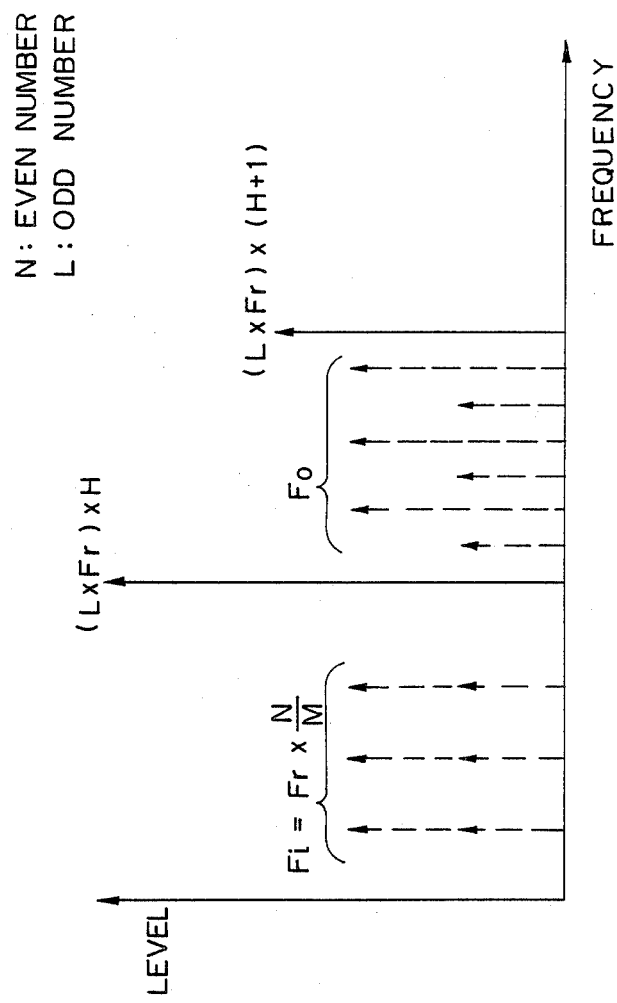

By setting such that M=1, N=even number, and L=odd number in the equations (7) and (8), a frequency relation as shown in FIG. 5 can also be realized. In this case, the frequency steps of $F_o$ are similar to those in FIG. 4. However, since N is an even number, a cheap fixed frequency divider (prescaler) which can be used up to high frequencies can, for example, be provided on the input side of the variable frequency divider 6. In this case as well, a signal in a frequency band which is twice as wide as the input frequency band of the variable frequency divider 6 can be output. However, in this case, it is necessary to provide a filter circuit such as to limit the input signal having the frequency of $(N/M)F_r$ (N is an odd number) of the variable frequency divider and to allow the input signal having the frequency of $(N/M)F_r$ (N is an even number) to pass.

Figure 6:
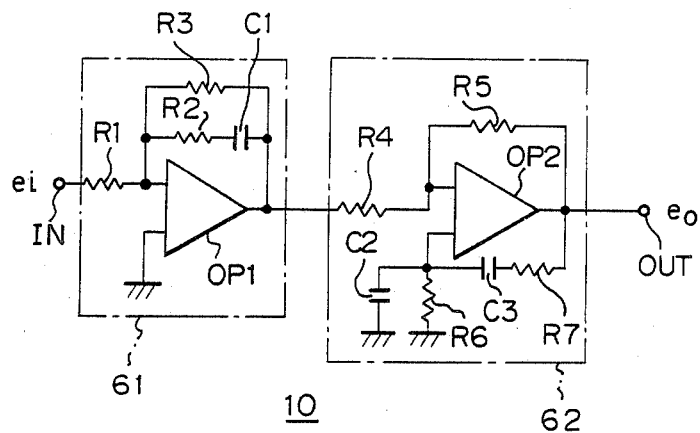
FIG. 6 is an electric circuit diagram showing a loop filter which can be used in the PLL frequency synthesizer shown in FIG. 2.

FIG. 6 is an electric circuit diagram showing a loop filter 10 which can be used in the PLL frequency synthesizer of the present invention. In the diagram, $OP_1$ and $OP_2$ denote operational amplifiers; $R_1$ to $R_7$ are resistor elements; $C_1$ to $C_3$ capacitor elements; IN an input terminal (voltage value $e_i$; namely, an output of the polarity inverter 11); and OUT an output terminal (voltage value $e_o$; namely, an input to the VCO 4). Numeral 61 denotes an active low pass filter constituted by the foregoing circuit elements $OP_1$, $R_1$ to $R_3$ and $C_1$; and 62 indicates an amplifier also serving as a sweep oscillator which is constituted by the foregoing circuit elements $OP_2$, $R_4$ to $R_7$, $C_2$ and $C_3$.

The operation will now be described. In FIG. 6, the voltage $e_i$ at the input terminal IN is band-limited by the active low pass filter 61 and, thereafter, it is amplified to a predetermined level by the amplifier 62, so that a voltage $e_o$ is output at the output terminal OUT. In the PLL frequency synthesizer shown in FIG. 2, when the synchronization has been cancelled, the amplifier/-sweep oscillator 62 functions as an oscillator. On the other hand, when the phase synchronizing loop has been locked, the amplifier/sweep oscillator 62 stops oscillating and functions as an amplifier.

Since the loop filter in FIG. 6 is constituted by the low pass filter 61 and the amplifier/sweep oscillator 62, the frequency band is not limited in respect of noises which may be generated from the operational amplifier $OP_2$ constituting the amplifier/sweep oscillator at the post stage. Thus, there is a problem in that noises in the high frequency range are not limited. To solve this problem, the operational amplifier $OP_2$ of the low noises must be used at the post stage. This leads to the problem that a very expensive low-noise operational amplifier must be used, and so on.

Figure 7:
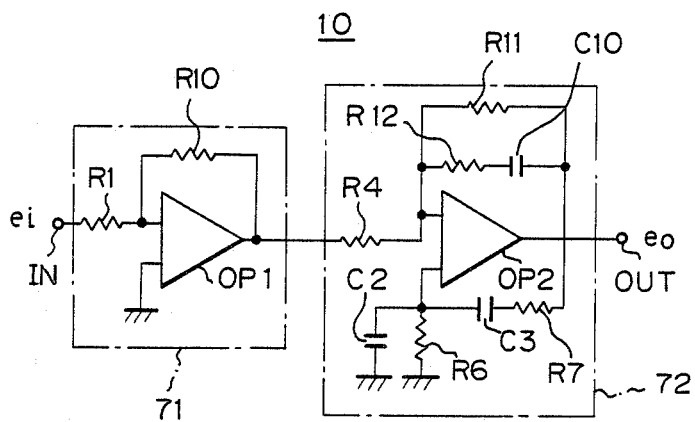
FIG. 7 is an electric circuit diagram showing another loop filter which can be used in the PLL frequency synthesizer in FIG. 2.

The active filter shown in FIG. 7 is the loop filter which can be used in the PLL frequency synthesizer of the invention and comprises the amplifier and the low pass filter. The low pass filter is arranged at the last stage and the amplifier is arranged at the first stage of this filter. Namely, these components are arranged in the order opposite to that employed in the loop filter shown in FIG. 6. Since the low pass filter is arranged at the last state, the noises which are generated from the amplifier at the first stage are also band-limited together with the input voltage, so that noise in the high frequency range is reduced.

Practically speaking, in the diagram of FIG. 7, $OP_1$ and $OP_2$ denote the operational amplifiers; $R_1$, $R_4$, $R_6$, $R_7$ and $R_{10}$ to $R_{12}$ are resistor elements; $C_2$, $C_3$ and $C_{10}$ capacitor elements; 71 a voltage amplifier constituted by the circuit elements $OP_1$, $R_1$ and $R_{10}$; and 72 a low pass filter/sweep oscillator which is constituted by the circuit elements $OP_2$, $R_4$, $R_6$, $R_7$, $R_{11}$, $R_{12}$, $C_3$ and $C_{10}$. In addition, IN denotes the input terminal (voltage value $e_i$) and OUT indicates the output terminal (voltage value $e_o$).

The operation and effects will now be described.

Assuming that the low pass filter 72 in FIG. 7 has the gain-frequency characteristics shown at 81 in FIG. 8(a), the noises which are generated from the operational amplifiers $OP_1$ and $OP_2$ in FIG. 7 have the characteristics shown at 82 and 83 in FIG. 8(c). The total noises generated by the two operational amplifiers have the characteristics shown at 84 in FIG. 8(c). It should be noted here that the noises generated by the amplifier 71 at the first stage in FIG. 7 are transmitted through the low pass filter 72 in FIG. 7 so that they are band-limited and the noises are also reduced even in the high frequency range.

This point will be clearly understood by a comparison with the circuit shown in FIG. 6. In the circuit of FIG. 6, the low pass filter 61 is arranged at the first stage and the amplifier 62 is arranged at the post stage. Therefore, the noises generated from the operational amplifiers $OP_1$ and $OP_2$ in FIG. 6 have the characteristics shown at 85 and 86 in FIG. 8(b). The total noises generated by the two operational amplifiers have the characteristics shown at 87 in FIG. 8(b). As described above, in the circuit of FIG. 6, the amplifier 62 is arranged at the post stage and its output noises are not band-limited, so that the noise output level is relatively large in the high frequency range. Therefore, as will be obvious from a comparison between FIGS. 8(b) and 8(c), in a frequency range lower than the frequency $f_1$, the output noise level does not change; however, the output noise level in the circuit of FIG. 7 is remarkably reduced in a frequency range higher than the frequency $f_2$. On the other hand, in order to accomplish similar noise reduction in the circuit of FIG. 6, an operational amplifier with an extremely low noise level must be used at the post stage.

Although the circuit of FIG. 7 uses two operational amplifiers, a similar effect can also be obtained with three or more operational amplifiers.

Having now described a limited number of embodiments of the present invention, it should now be apparent to those skilled in the art that numerous other embodiments and modifications thereof are contemplated as falling within the scope of the present invention as defined by the appended claims.

What is claimed is:

1. A PLL frequency synthesizer comprising:
voltage controlled oscillator means which oscillates in response to a frequency signal corresponding to a control signal to be input and which outputs said frequency signal as an output of said PLL frequency synthesizer;
multiplier means for multiplying a reference frequency signal to be input;
mixer means for mixing the frequency signal which is output from said voltage controlled oscillator and the multiplied reference frequency signal which is output from said multiplier, and for outputting a frequency signal representative of a difference therebetween;
variable frequency divider means for dividing said difference frequency signal at a variable dividing ratio;
fixed frequency divider means for dividing said reference frequency signal at a predetermined dividing ratio;
frequency phase comparator means for detecting a phase difference between an output signal from said variable frequency divider and an output signal from said fixed frequency divider and for outputting a phase difference signal therebetween;
filter means for removing high frequency components of said phase difference signal which is supplied as said control signal to said voltage controlled oscillator; and
means for switching the polarity of said phase difference signal;
wherein an output frequency of the voltage controlled oscillator can be switched to either a frequency higher than or a frequency lower than the frequency which is H (H is a positive integer) times as high as the output frequency of said multiplier, or the output frequency of the voltage controlled oscillator can be switched to either a frequency higher than the frequency which is H times as high as the output frequency of the multiplier or a frequency lower than the frequency which is (H+1) times as high as the output frequency of the multiplier.

2. A synthesizer according to claim 1, wherein said polarity switching means is a polarity inverter.

3. A synthesizer according to claim 2, wherein said polarity inverter is connected between said frequency phase comparator and said filter means.

4. A synthesizer according to claim 2, wherein said polarity inverter is connected between said filter means and said voltage controlled oscillator.

5. A synthesizer according to claim 1, wherein said polarity switching means is switching means for switching the output signal of said variable frequency divider and the output signal of said fixed frequency divider on the input side of said frequency phase comparator.

6. A synthesizer according to claim 1, wherein said mixer is a harmonic mixer.

7. A synthesizer according to claim 1, wherein said filter means is an active filter circuit consisting of a low pass filter at the front stage and an amplifier/sweep oscillator at the post stage.

8. A synthesizer according to claim 1, wherein said filter means is an active filter circuit consisting of a voltage amplifier at the front stage and a low filter/sweep oscillator at the post stage.

* * * * *

UNITED STATES PATENT AND TRADEMARK OFFICE
CERTIFICATE OF CORRECTION

PATENT NO. : 4,797,637
DATED : January 10, 1989
INVENTOR(S) : Koyo Kegasa et al

It is certified that error appears in the above-identified patent and that said Letters Patent is hereby corrected as shown below:

On the face of the patent under the indication of "Assignee" please change DAISHA to --KAISHA--.

In column 8 of the patent, in Claim 8, on line 3, after "low" insert --pass--.

Signed and Sealed this

Fifth Day of September, 1989

Attest:

DONALD J. QUIGG

*Attesting Officer*      *Commissioner of Patents and Trademarks*